US009840410B2

(12) United States Patent
    Classen

(10) Patent No.: US 9,840,410 B2
(45) Date of Patent: Dec. 12, 2017

(54) MICROMECHANICAL COMPONENT

(71) Applicant: Robert Bosch GmbH, Stuttgart (DE)

(72) Inventor: Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/268,017

(22) Filed: Sep. 16, 2016

(65) Prior Publication Data

US 2017/0081180 A1   Mar. 23, 2017

(30) Foreign Application Priority Data

Sep. 18, 2015   (DE) .......................... 10 2015 217 918

(51) Int. Cl.
*B81C 1/00* (2006.01)
*B81B 7/00* (2006.01)

(52) U.S. Cl.
CPC .......... *B81C 1/00238* (2013.01); *B81B 7/007* (2013.01); *B81B 2201/0235* (2013.01); *B81B 2207/012* (2013.01); *B81B 2207/07* (2013.01); *B81C 2203/0109* (2013.01); *B81C 2203/035* (2013.01); *B81C 2203/0792* (2013.01); *H01L 2224/11* (2013.01)

(58) Field of Classification Search
CPC ........ B81C 1/00238; B81C 2203/0109; B81C 2203/035; B81C 2203/0792; B81B 7/007; B81B 2201/0235; B81B 2207/012; B81B 2207/07
USPC .................................................. 257/418, 415
See application file for complete search history.

(56) References Cited

U.S. PATENT DOCUMENTS

| 7,250,353 B2 | 7/2007 | Nasiri et al. | |
|---|---|---|---|
| 7,442,570 B2 | 10/2008 | Nasiri et al. | |
| 2013/0001710 A1 | 1/2013 | Daneman et al. | |
| 2013/0277774 A1* | 10/2013 | Frey | B81B 7/007 257/415 |
| 2013/0285165 A1* | 10/2013 | Classen | B81C 1/00238 257/415 |
| 2015/0197419 A1* | 7/2015 | Cheng | B81B 7/0006 257/418 |
| 2016/0090300 A1* | 3/2016 | Tsai | H04R 17/02 257/254 |

FOREIGN PATENT DOCUMENTS

| DE | 102009000167 A1 | 7/2010 |
|---|---|---|
| DE | 102009029202 A1 | 3/2011 |
| DE | 102012206875 A1 | 10/2013 |
| DE | 102012208032 A1 | 11/2013 |

* cited by examiner

*Primary Examiner* — Cuong Q Nguyen
*Assistant Examiner* — Tong-Ho Kim
(74) *Attorney, Agent, or Firm* — Norton Rose Fulbright US LLP

(57) ABSTRACT

A method for manufacturing a micromechanical component, including: providing a MEMS wafer; structuring the MEMS wafer proceeding from a surface of a second substrate layer of the MEMS wafer, at least one electrically conducting connection being formed between a first substrate layer and the second substrate layer of the MEMS wafer; providing a cap wafer; joining the MEMS wafer to the cap wafer; structuring the MEMS wafer proceeding from a surface of the first substrate layer of the MEMS wafer; providing an ASIC wafer; and joining the ASIC wafer to the joint of the MEMS wafer and the cap wafer.

17 Claims, 9 Drawing Sheets

MICROMECHANICAL COMPONENT

RELATED APPLICATION INFORMATION

The present application claims priority to and the benefit of German patent application no. 10 2015 217 918.4, which was filed in Germany on Sep. 18, 2015, the disclosure of which is incorporated herein by reference.

FIELD OF THE INVENTION

The present invention relates to a micromechanical component and to a method for manufacturing a micromechanical component.

BACKGROUND INFORMATION

Micromechanical sensors for measuring acceleration, rotation rate, magnetic field and pressure, for example, are known and are manufactured for various applications in the automotive and consumer fields in mass production.

DE 10 2009 000 167 A1 describes an inertial sensor including two micromechanical planes. This allows sensor topologies to be implemented which enable considerable performance increases, for example with respect to an offset stability of acceleration sensors. A z-acceleration sensor is implemented, in which the movable mass is formed of two micromechanical layers (first and second MEMS functional layers) and in which capacitive evaluation electrodes are situated both beneath and above the movable structure, namely in the redistribution layer on the substrate wafer and in the second MEMS functional layer.

This so-called fully differential electrode system may be used to increase a capacitance distribution (capacitance/area) on the one hand, and also to achieve a good robustness with respect to substrate deformations (caused by assembly stress, for example) on the other hand. The former aspect results in an improved signal-to-noise ratio, the second in an improved offset stability of the sensor, among other things.

Furthermore, approaches are known in which a MEMS wafer and an evaluation ASIC wafer are mechanically and electrically connected to one another using wafer bonding methods, which is referred to as "vertical integration" or "hybrid integration" or "3D integration" and is known from U.S. Pat. No. 7,250,353 B2 or U.S. Pat. No. 7,442,570 B2, for example. In this way, it is possible to implement sensor topologies for inertial sensors with movements perpendicular to the chip level. A movable MEMS structure is situated on an evaluation ASIC, preferably a CMOS wafer, the uppermost metal layer of the ASIC acting as a fixed counter electrode.

An extension of the above-mentioned technology provides that, in addition to evaluation electrodes in the CMOS wafer, evaluation electrodes are provided in the MEMS wafer, as is known from DE 10 2012 208 032 A1, for example. In this way, an integration density, in the present case a capacitance per area of the components, may be increased, which may result in reduced noise and/or a smaller space requirement for the components.

From DE 10 2012 208 032 A1, a system including two micromechanical layers is known, which are linked with the aid of a vertical integration process. The MEMS wafer is manufactured in a surface micromechanical manner and is mechanically and electrically connected to an ASIC with the aid of a wafer bonding method. In addition to the substrate, the MEMS wafer has three polycrystalline silicon layers (one redistribution layer and two micromechanical layers), which may be structured largely independently of one another. Ultimately, the MEMS wafer thus includes two micromechanical functional layers and one strip conductor plane. The two micromechanical functional layers are joined to one another and form a single-piece or integral mass element. With the aid of through-silicon vias (TSV), which are formed in the ASIC wafer, an electrical connection to redistribution layers of the ASIC wafer may be implemented from the outside.

DE 10 2009 029 202 A1 describes a stacked arrangement of micromechanical components made up of multiple MEMS layers, in which a first MEMS structure is situated in one functional layer and at least one further MEMS structure is at least partially situated in at least one further functional layer. Such structures, in which the integration layer is also increased, may be implemented with the aid of a process which is known from DE 10 2009 000 167 A1.

Furthermore, vertically integrated components are known, in which two wafer stacks are bonded to one another, the two wafer bonds being formed by a MEMS wafer and a CMOS wafer, as is known from DE 10 2012 206 875 A1, for example, the MEMS wafer initially being applied to the CMOS wafer with the aid of a wafer bonding method, and thus in total a quadruple wafer stack is formed. This arrangement also allows an integration density of the components to be increased. The arrangement may be advantageous if the space requirement for MEMS functional structures and the electronic evaluation circuit are approximately equally large.

A wafer bond for a micromechanical inertial sensor is known from US 2013/0001710 A1, a blind hole being introduced into a first and a second MEMS functional layer, situated beneath the first, for the purpose of forming a sensor membrane for a capacitive pressure sensor. In this way, it is possible to suitably dimension a thickness of the sensor membrane.

SUMMARY OF THE INVENTION

It is an object of the present invention to provide an improved micromechanical component and a method for the manufacture thereof.

According to a first aspect, the object is achieved by a method for manufacturing a micromechanical component, including the following steps:
providing a MEMS wafer;
structuring the MEMS wafer proceeding from a surface of a second substrate layer of the MEMS wafer, at least one electrically conducting connection being formed between a first substrate layer and the second substrate layer of the MEMS wafer;
providing a cap wafer;
joining the MEMS wafer to the cap wafer;
structuring the MEMS wafer proceeding from a surface of the first substrate layer of the MEMS wafer;
providing an ASIC wafer; and
joining the ASIC wafer to the joint of the MEMS wafer and the cap wafer.

In this way, two MEMS structures may be provided in MEMS functional layers which are situated on top of one another at least in sections, these being selectively connected either electrically and mechanically to one another or only mechanically connected to one another. In this way, an advantageous option may be provided for electrically activating the movable MEMS structures selectively as electrodes.

According to a second aspect, the object is achieved by a micromechanical component, including:
- a MEMS wafer including at least two movable MEMS structures situated on top of one another at least in sections, a first substrate layer and a second substrate layer of the MEMS wafer being designed to be electrically conductively connectable to one another at least in sections; and
- an ASIC wafer, the MEMS wafer being functionally joined to the ASIC wafer, the wafers being capped with the aid of a cap wafer.

Preferred specific embodiments of the method and of the micromechanical component are the subject matter of dependent claims.

One advantageous refinement of the method provides for the joining of the ASIC wafer to the joint of the MEMS wafer and the cap wafer to be carried out with the aid of a metallic bonding process. In this way, a proven joining technique may be used to join the two wafers.

Another advantageous refinement of the method provides for the metallic bonding process to be designed as a eutectic Al—Ge bonding process or as a Cu—Sn-SLID bonding process or as a metallic direct bonding process. In this way, different bonding methods may advantageously be used to functionally join the wafers.

Another advantageous refinement of the method provides for the electrically conducting connection between the first and second substrate layers of the MEMS wafer to be formed of polysilicon or of a metal, in particular tungsten. In this way, a known process sequence for providing an electrically conducting connection between the two substrate layers may be used.

Further preferred specific embodiments of the method provide that at least one contacting element for electrically contacting the micromechanical component is designed as a through-silicon via in the ASIC wafer or as a wire bonding element. This advantageously provides different options for electrically contacting the component.

A further advantageous refinement of the method provides for the MEMS wafer to be formed with the aid of an SOI wafer. In this way, monocrystalline silicon material having a high degree of purity may advantageously be provided. Moreover, layer thicknesses of the substrate may be formed largely independently of one another.

The present invention is described in greater detail hereafter with further features and advantages based on several figures. All described features, regardless of their back reference in the patent claims and regardless of their representation in the description and in the figures, form the subject matter of the present invention. Identical or functionally equivalent components have identical reference numerals. The figures are in particular intended to illustrate the principles that are essential to the present invention and are not necessarily shown true to scale.

DETAILED DESCRIPTION OF THE INVENTION

Figure 1:
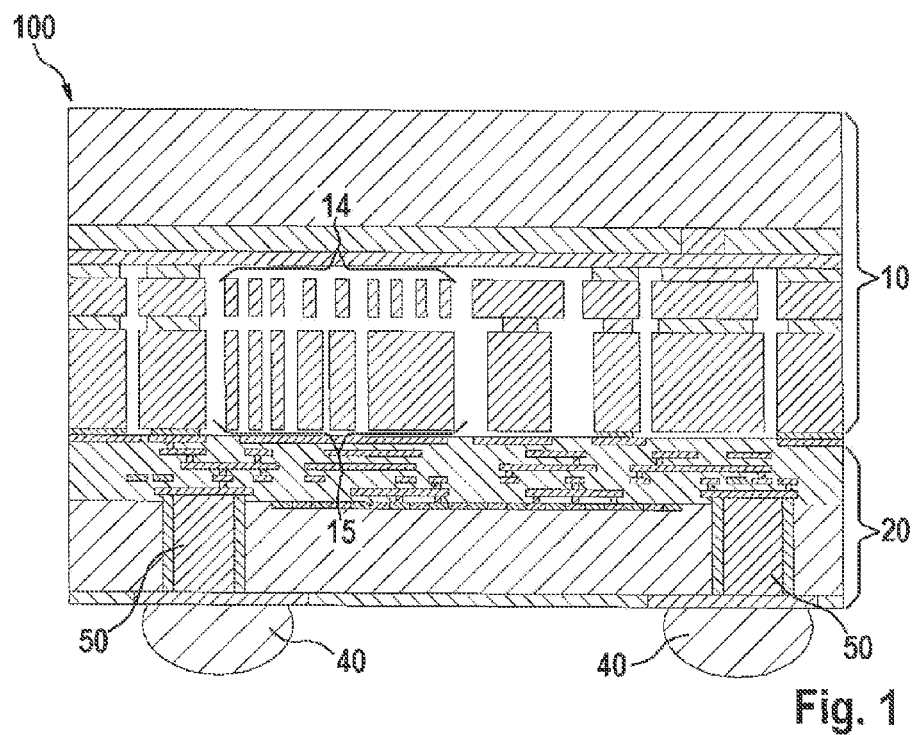
FIG. 1 shows a conventional micromechanical sensor topology.

FIG. 1 shows a cross section through a conventional micromechanical component 100 including a MEMS wafer 10 and an ASIC wafer 20. Movable micromechanical MEMS structures 14, 15 are configured in MEMS wafer 10. With the aid of a through-silicon via 50 having an additional rewiring in the form of a redistribution layer (RDL), in combination with contacting elements 40 in the form of solder balls, it is possible to implement an electrical contacting of electronic circuit elements of ASIC wafer 20.

The following figures show results of process steps for manufacturing specific embodiments of micromechanical component 100 according to the present invention. FIGS. 2 through 8 show a preparation of a two-layer MEMS wafer 10 including a first and a second silicon layer for wafer bonding onto a cap wafer 30. Cap wafer 30 preferably includes previously created cavities, which are, e.g., created with the aid of a trench process (alternatives are: KOH etching or isotropic SF6 etching). The bonding method is preferably a high-temperature fusion bond between the second silicon layer of the MEMS wafer and an oxide layer on the cap wafer. Other bonding methods, such as glass frit bonding or metallic bonding methods (eutectic or solid liquid interdiffusion (SLID)) or direct bonding are also possible as alternatives.

Figure 2:
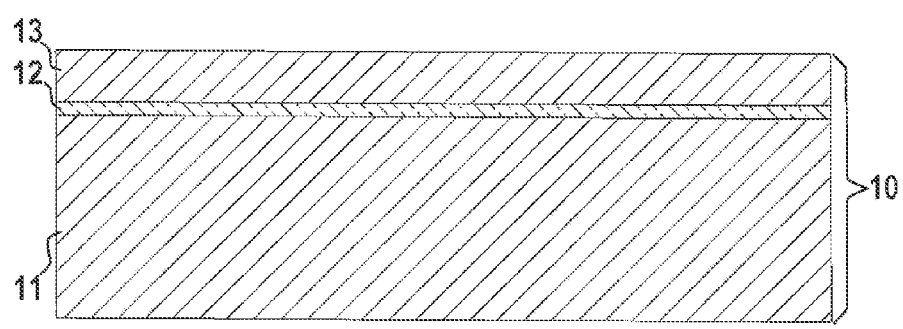
FIGS. 2 through 15 show results of individual process steps for manufacturing the micromechanical component according to the present invention.

FIG. 2 shows a cross section through an MEMS wafer 10 including a first substrate layer 11 (preferably silicon substrate), an insulating layer 12 situated thereon (preferably an oxide material), and a second substrate layer 13 (preferably silicon substrate) situated on insulating layer 12. MEMS wafer 10 is thus formed of an SOI wafer in terms of its basic structure.

Figure 3:
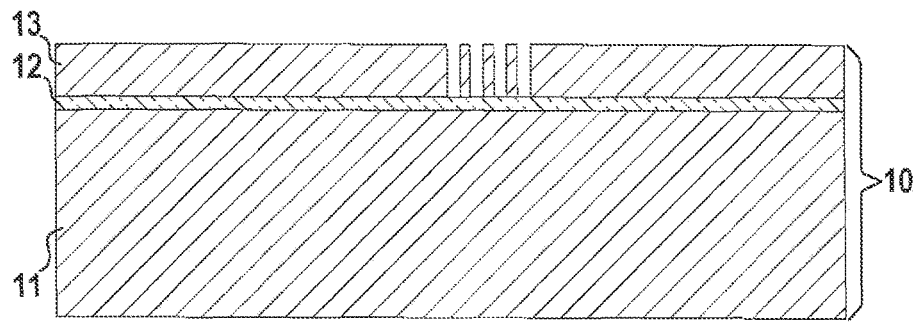

FIG. 3 shows a cross section through the system of FIG. 2, a first trench of second substrate layer 13 having been implemented.

Figure 4:
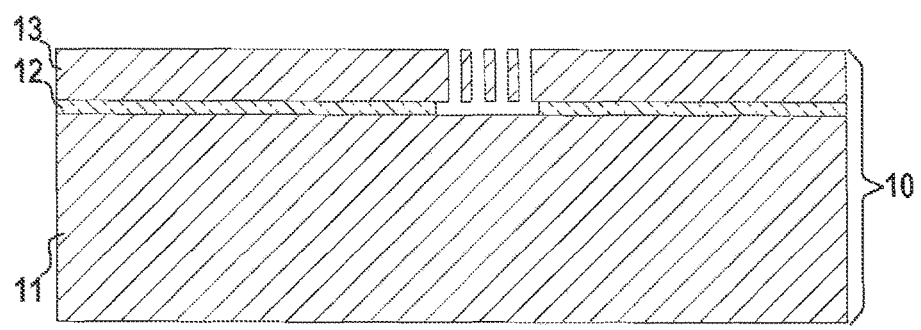

It is apparent from the cross-sectional view of FIG. 4 that material of second substrate layer 13 and material of insulating layer 12 was etched away beneath the structure of second substrate layer 13 thus formed with the aid of a gas phase etching step.

Figure 5:
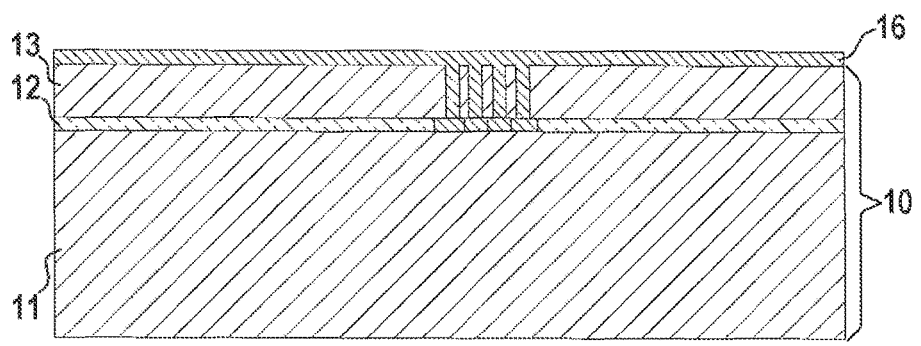

FIG. 5 indicates that a filling of the opened access holes with a conducting material 16, preferably a polysilicon material, was carried out. Alternatively, a metallic filling, for example using tungsten, is also conceivable. In this way, first substrate layer 11 may be connected in a locally limited electrically conducting manner to second substrate layer 13.

Figure 6:
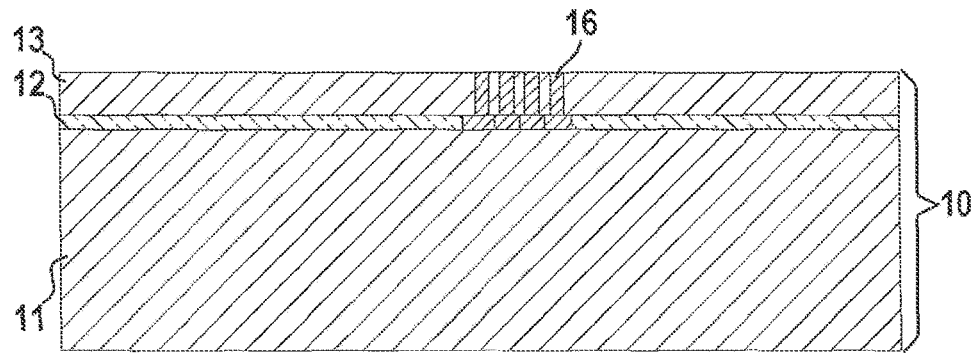

It is apparent from the cross-sectional view of FIG. 6 that a preferably smooth surface of second substrate layer 13 for a subsequent wafer bonding is provided with the aid of a chemical mechanical polishing (CMP) process step.

Figure 7:
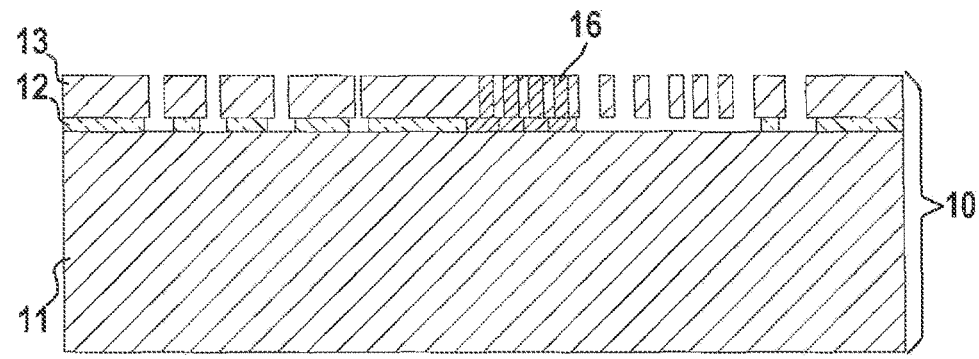

It is apparent from the cross-sectional view of FIG. 7 that a second trench of second substrate layer 13 was carried out, whereby a structuring of first substrate layer 13 was implemented. Moreover, a second gas phase etching step of insulating layer 12 was carried out, whereby insulating layer 12 was locally exposed. The second gas phase etching step preferably takes place in a time-controlled manner.

Figure 8:
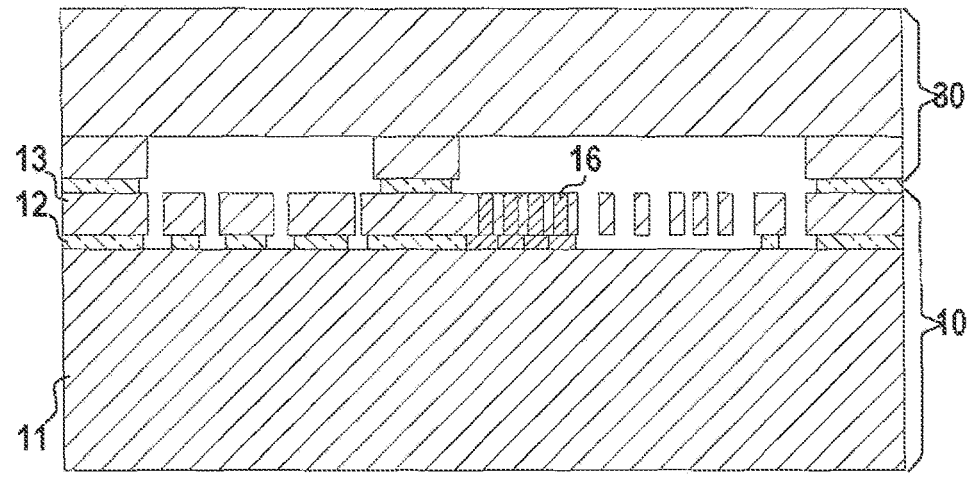

FIG. 8 shows MEMS wafer 10 of FIG. 7 after a wafer bonding process including a cap wafer 30, the wafer bonding preferably having been carried out in the form of a high-temperature fusion bond. Alternative bonding methods are plasma-activated direct bonding, glass frit bonding or metallic bonding methods.

Figure 9:
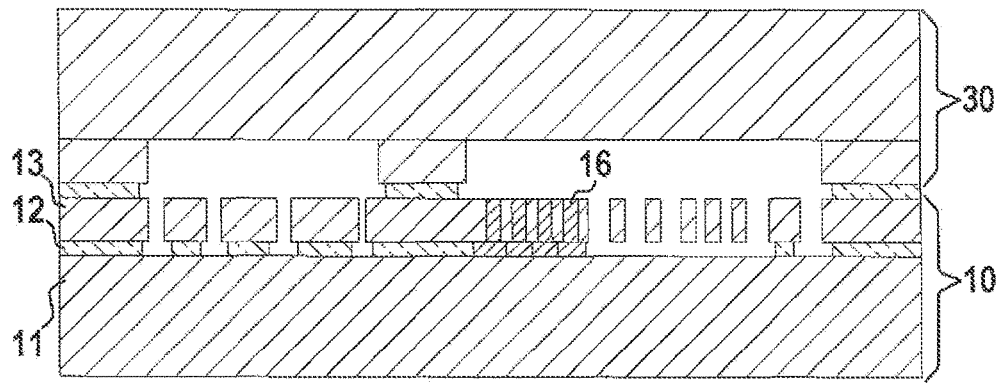

FIG. 9 shows a result of back-thinning or back-grinding, and possibly of a CMP step, of first substrate layer 11 of MEMS wafer 10 to the setpoint thickness.

Figure 10:
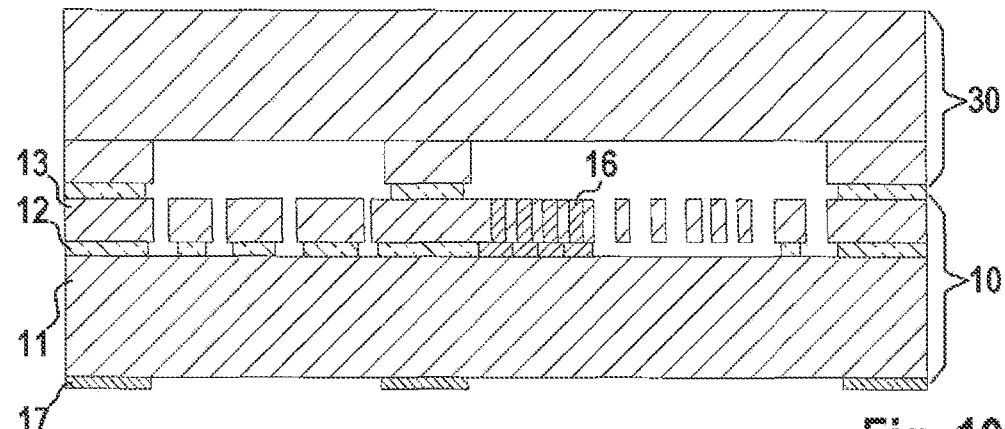

FIG. 10 shows areas including bonding material 17 applied to first substrate layer 11, preferably a germanium layer for the subsequent bonding with an ASIC wafer 20.

Figure 11:
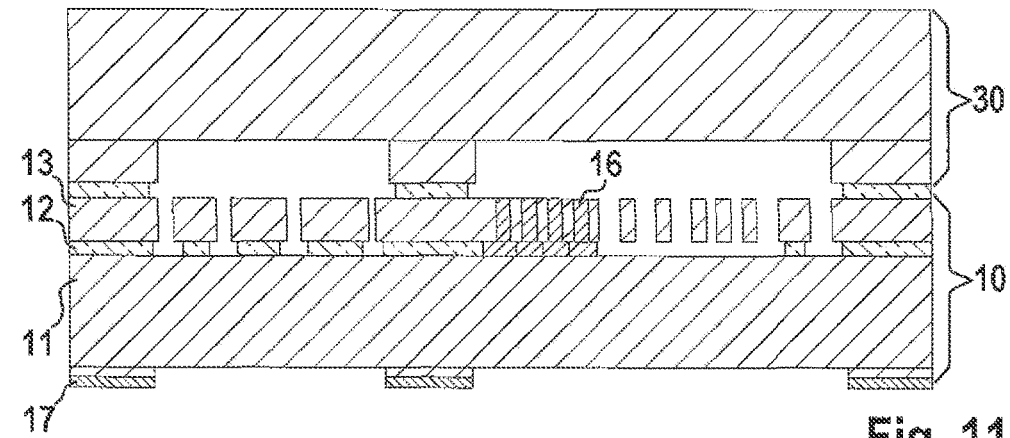

It is apparent from the cross-sectional view of FIG. 11 that first substrate material 11 was removed between areas including bonding material 17, preferably with the aid of a time-controlled etching process, in order to thereafter provide a kind of spacer (standoff) for setting a defined minimum distance during a subsequent bonding with ASIC wafer 20.

Figure 12:
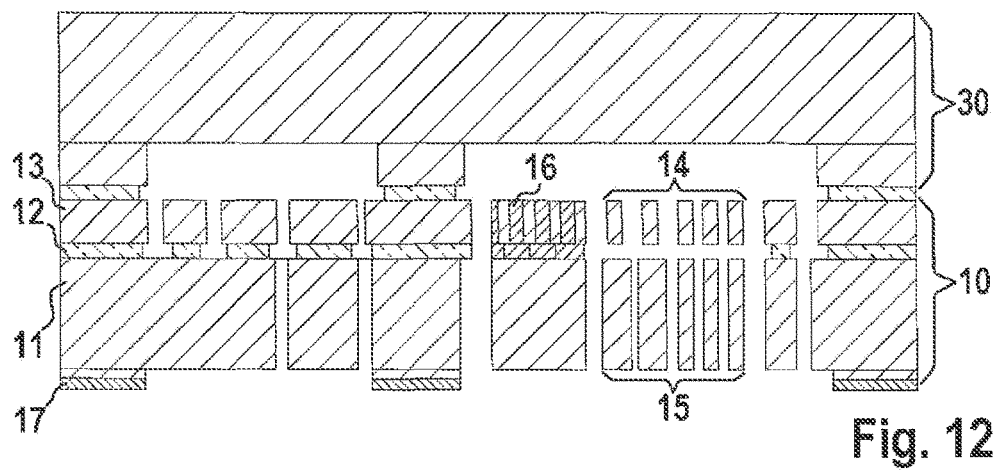

It is apparent from the cross-sectional view of FIG. 12 that now a second functional trench, proceeding from a surface of first substrate layer 11 of MEMS wafer 10, was carried out. In this way, through-holes may be provided in sections in ASIC wafer 20 in those areas in which no insulating layer 12 was present. As a result, MEMS structures 14, 15 which are movable independently of one another at least in sections may thus be exposed in a defined manner in two substrate layers 11, 13. It is also possible to etch accessible subareas of second substrate layer 13.

Figure 13:
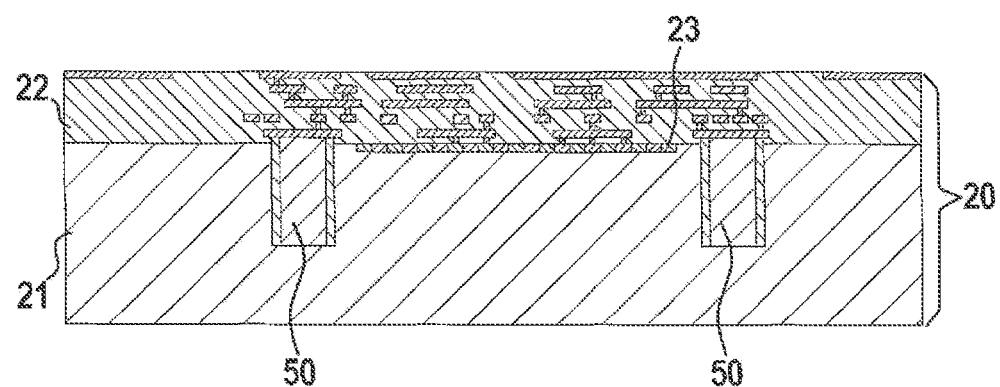

FIG. 13 shows a simplified cross section through a substrate wafer, preferably in the form of a CMOS evaluation ASIC wafer 20 including a substrate layer 21, a circuit layer 22 and a transistor layer 23. ASIC wafer 20 furthermore includes two blind holes, which are provided for electrical through-silicon vias 50 to be formed thereafter and which for this purpose are filled with a conducting material, preferably with copper or polycrystalline silicon, in a via-middle process, in which initially the transistor circuits, then the TSV blind holes, and finally the metal oxide stack of the CMOS back end are created.

Figure 14:
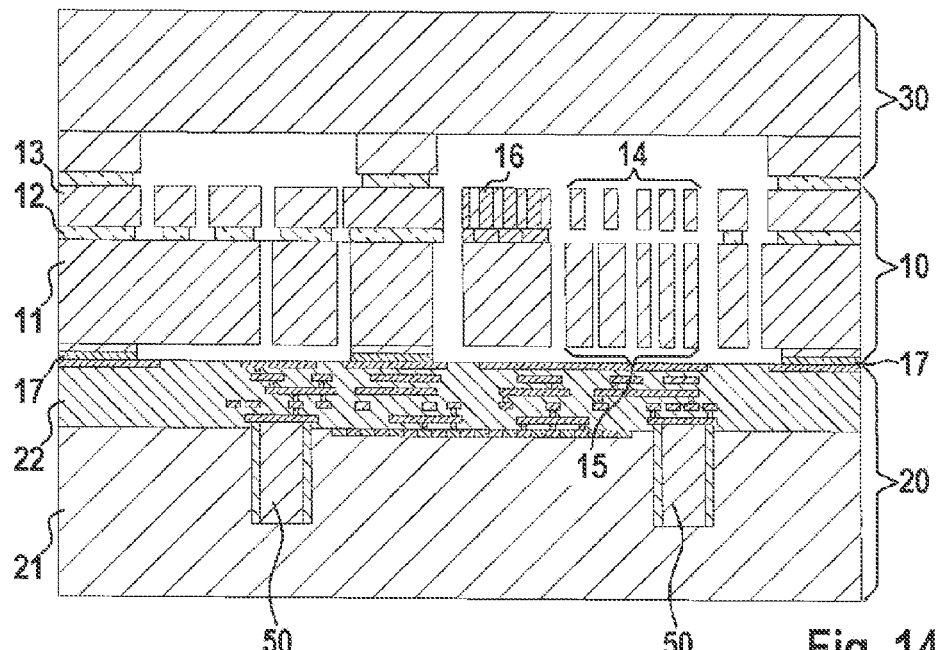

Afterward, as is illustrated in FIG. 14, the combined MEMS/cap wafer may be metallically bonded to the ASIC wafer 20, preferably with the aid of a eutectic aluminum-germanium bonding method or alternatively with the aid of a Cu—Sn-SLID bonding method. FIG. 14 shows a cross-sectional view in which ASIC wafer 20 is bonded to the joint of cap wafer 30 and MEMS wafer 10.

Figure 15:
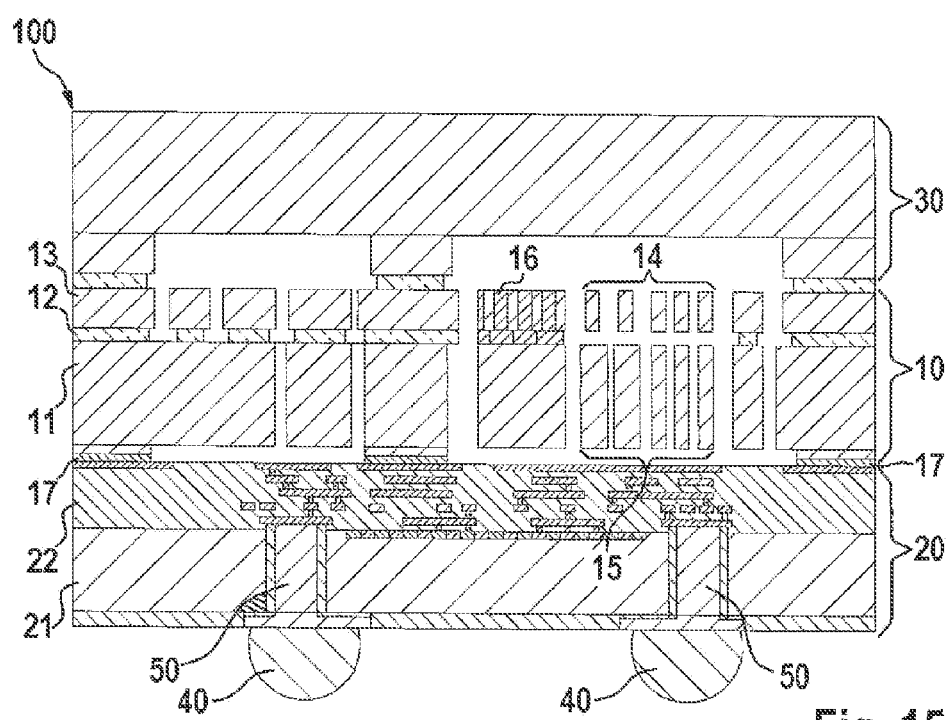

Lastly, as is illustrated in FIG. 15, the blind holes filled with metal are ground open from the backside of ASIC wafer 20, electrical connections are distributed over a redistribution layer insulated by ASIC substrate layer 21 on the ASIC backside, and solder balls 40 are applied for the later circuit board assembly of micromechanical component 100.

It is apparent from the cross-sectional view of FIG. 15 that now substrate layer 21 of ASCI wafer 20 was back-thinned to the setpoint thickness, whereby through-silicon vias 50 were exposed. Solder balls 40 were situated on the backside of the ASIC and joined to the exposed through-silicon vias 50 with the aid of the redistribution layer. In this way, an electrical contacting of the entire system is made possible.

Figure 16:
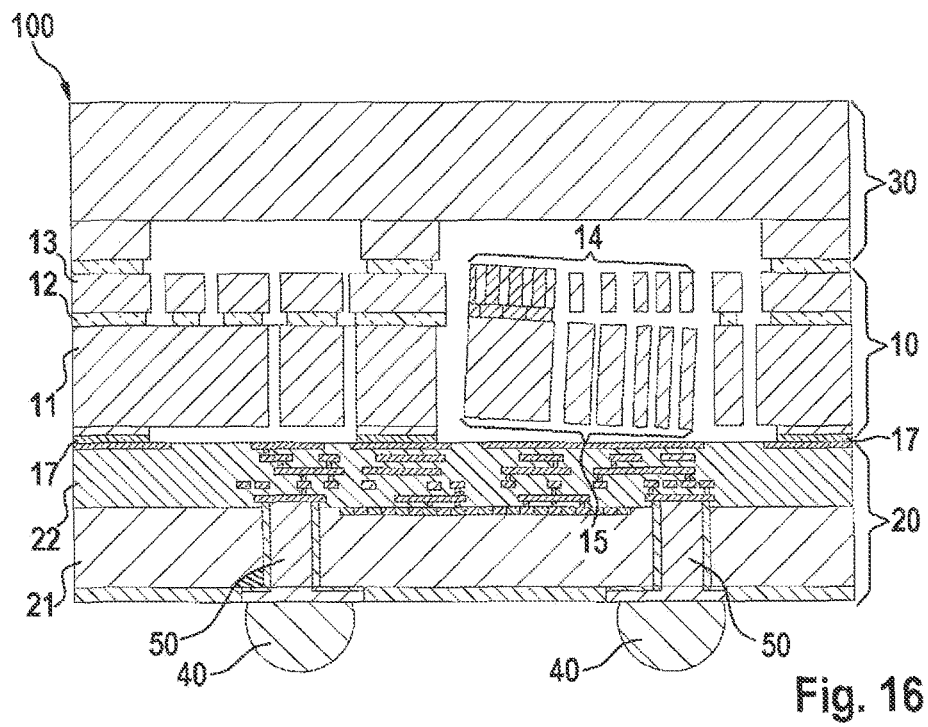
FIG. 16 shows an indication of a mechanical mobility of the MEMS structures of the micromechanical component.

FIG. 16 indicates that MEMS areas within the overall system are designed to be freely movable with the aid of the provided process sequence. The figure in particular illustrates that, similarly to FIG. 1, movable MEMS structures 14, 15 having a fully differential electrode arrangement including an upper fixed electrode in first substrate layer 11 and a lower fixed electrode in an uppermost metallization layer of ASIC wafer 20 may be implemented. It is also advantageously possible to implement exposed movable MEMS areas, in which the first and second substrate layers are mechanically connected to one another, but electrically separated from one another.

Figure 17:
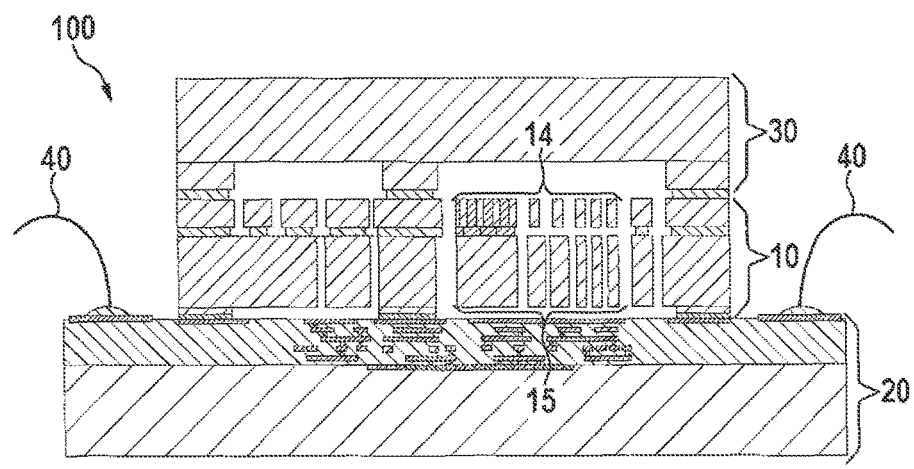
FIG. 17 shows an alternative specific embodiment of the micromechanical component.
Figure 18:
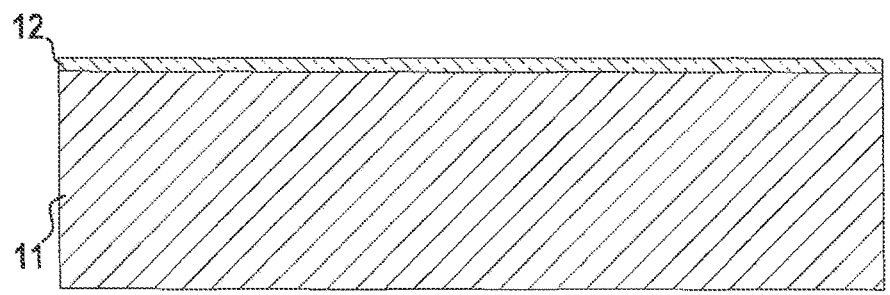
FIGS. 18 through 21 show results of individual process steps for providing the MEMS wafer for the micromechanical component.

FIG. 17 shows an alternative form of a micromechanical component 100 including a cap wafer 30 bonded onto MEMS wafer 10, a wire bonding having been carried out for an external contacting of micromechanical component 100. An external contacting element 40 in the form of a bonding wire element is apparent, which is designed as a front side contact on ASIC wafer 20. The contacts are applied by opening the combined MEMS/cap wafer in the bond pad area, preferably with the aid of a trench process or a sawing process. In FIG. 17, the bonding wires are situated on both sides of ASIC wafer 20; of course, it is also possible, however, to guide out the pads only on one side of ASIC wafer 20 or on two sides, which are oriented with respect to one another at a 90° angle (not shown).

FIGS. 18 through 21 show an implementation of MEMS wafer 10 which is alternative to FIGS. 2 through 6, including a first and a second substrate layer 11, 13. In this case, standard methods of surface micromechanics are used. The starting point is a first substrate layer 11, onto which an insulating layer 12, preferably an oxide layer, is applied, preferably with the aid of thermal oxidation. These methods may be simpler and more cost-effective due to a lower price for the raw material. The grown second substrate layer 13 is predominantly polycrystalline in this case.

The layer thickness ratios of first and second substrate layers 11, 13 shown in all preceding figures are to be regarded only by way of example. The provided method may also be used to form both layer thicknesses equally, or to form the second substrate layer thicker than the first substrate layer, without fundamental changes in the process sequence.

Figure 19:
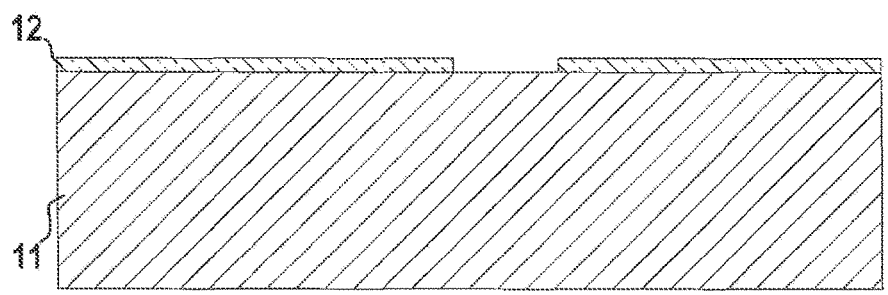

FIG. 19 shows an opened insulating layer 12 for forming contact holes.

Figure 20:
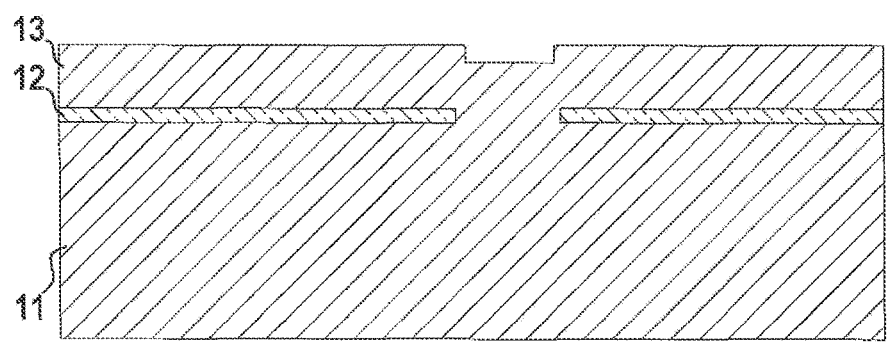

FIG. 20 shows a deposition of a second substrate layer 13 on insulating layer 12, either as polycrystalline silicon or via epitaxial growth (including a polycrystalline starting layer on oxide layer 12, not shown). A strong topography of the surface of second substrate layer 13 is created in the area of the contact hole. This may optionally be minimized via a plurality of small contact holes, in which a trench width is smaller than the layer thickness of second substrate layer 13.

Figure 21:
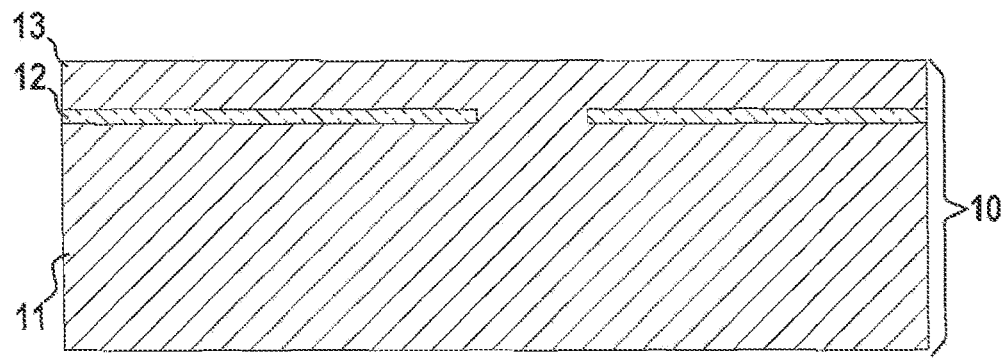

FIG. 21 shows a result of a CMP step of second substrate layer 13 for a preparation of a subsequent wafer bonding. The state of MEMS wafer 10 thus has large areas of second substrate layer 13, which are polycrystalline. The further process sequence takes place analogously to FIGS. 3 through 7.

Figure 22:
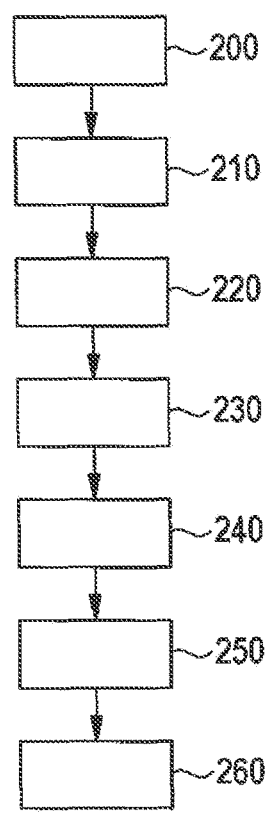
FIG. 22 shows a schematic sequence of one specific embodiment of the method according to the present invention.

FIG. 22 shows a schematic sequence of a method for manufacturing a micromechanical component 100.

In a step 200, a MEMS wafer 10 is provided.

In a step 210, a structuring of MEMS wafer 10 proceeding from a surface of a second substrate layer 13 of MEMS wafer 10 is carried out, at least one electrically conducting connection being formed between a first substrate layer 11 and second substrate layer 13 of MEMS wafer 10.

In a step 220, a cap wafer 30 is provided.

In a step 230, a joining of MEMS wafer 10 to cap wafer 30 is carried out.

In a step 240, a structuring of MEMS wafer 10, proceeding from a surface of first substrate layer 11 of MEMS wafer 10, is carried out.

In a step 250, an ASIC wafer 20 is provided.

Finally, in a step 260, a joining of ASIC wafer 20 to the joint of MEMS wafer 10 and cap wafer 30 is carried out.

In summary, the present invention provides a micromechanical component and a method for the manufacture thereof. The micromechanical component may be used particularly advantageously to implement fully differential capacitive electrode systems for MEMS elements deflectable perpendicularly to the chip level. A fixed bottom electrode is formed by the (preferably) uppermost metal layer of ASIC wafer 20, a fixed top electrode being formed in first substrate layer 11. The movable electrode is then situated between the bottom and top electrodes and is formed of areas of the second substrate layer.

The MEMS layers may advantageously be formed of monocrystalline material when an SOI wafer is used. In this way, smaller intrinsic stresses are possible, whereby inhomogeneities in the crystal structure of polycrystalline silicon may possibly result in intrinsic stresses. This may disadvantageously manifest itself, for example, in minor pre-deflections of the sensor structures, which result in undesirable offset signals in acceleration sensors.

The layer thicknesses of the MEMS structures are easily scalable, the thicknesses of the first and second substrate layers being easier to increase than with surface micromechanical methods. It is furthermore easily possible to create movable MEMS structures having mechanically connected, but electrically separate areas, this being implementable in a surface micromechanical approach only with increased complexity. This option may be advantageous to reduce the crosstalk between functional elements of a sensor (e.g., drive and detection circuits of a rotation rate sensor), or to use so-called fully differential evaluation methods for acceleration sensors, in which a shared sensor mass is divided into two electrically separate segments, which are activated by an ASIC in a push-pull mode and differentially evaluated. Parasitic signals, for example due to EMC or power supply rejection ratio (PSSR) interferences, which act in a push-push mode, may thus be effectively suppressed.

The micromechanical component is particularly advantageous for a micromechanical inertial sensor, e.g., for an acceleration sensor and/or a rotation rate sensor.

Although the present invention has been described above based on specific exemplary embodiments, those skilled in the art may implement specific embodiments which are not provided or only partially provided above, without departing from the core of the present invention.

What is claimed is:

1. A method for manufacturing a micromechanical component, the method comprising:
   providing a micro-electro-mechanical system (MEMS) wafer;
   structuring the MEMS wafer proceeding from a surface of a second substrate layer of the MEMS wafer to form a second movable MEMS structure, the surface of the second substrate layer facing in a second direction, at least one electrically conducting connection being formed between a first substrate layer and the second substrate layer of the MEMS wafer;
   providing a cap wafer;
   joining the MEMS wafer to the cap wafer;
   structuring the MEMS wafer proceeding from a surface of the first substrate layer of the MEMS wafer to form a first movable MEMS structure, the first movable MEMS structure and the second movable MEMS structure situated on top of one another at least in sections, the surface of the first substrate layer facing in a first direction substantially opposite to the second direction;
   providing an application-specific integrated circuit (ASIC) wafer; and
   joining the ASIC wafer to the joint of the MEMS wafer and the cap wafer.

2. The method of claim 1, wherein the joining of the ASIC wafer to the joint of the MEMS wafer and the cap wafer is carried out with a metallic bonding process.

3. The method of claim 2, wherein the metallic bonding process is configured as a eutectic Al—Ge bonding process or as a Cu—Sn-SLID bonding process or as a metallic direct bonding process.

4. The method of claim 1, wherein the electrically conducting connection between the first and second substrate layers of the MEMS wafer is formed of polysilicon or of a metal, in particular tungsten.

5. The method of claim 1, wherein at least one contacting element for electrically contacting the micromechanical component is configured as a through-silicon via in the ASIC wafer.

6. The method of claim 1, wherein at least one contacting element for electrically contacting the micromechanical component is configured as a wire bonding element.

7. The method of claim 1, wherein the MEMS wafer is formed with an SOI wafer.

8. The method of claim 1, wherein the joining of the MEMS wafer to the cap wafer is performed after the structuring the MEMS wafer to form the second movable MEMS structure.

9. The method of claim 1, wherein the structuring of the MEMS wafer to form the first movable MEMS structure is performed after the joining the MEMS wafer to the cap wafer.

10. The method of claim 1, wherein the joining of the ASIC wafer to the joint of the MEMS wafer and the cap wafer is performed after the structuring the MEMS wafer to form the first movable MEMS structure.

11. The method of claim 1, wherein the structuring of the MEMS wafer to form the first movable MEMS structure is performed after the structuring of the MEMS wafer to form the second movable MEMS structure.

12. A micromechanical component, comprising:
   a micro-electro-mechanical system (MEMS) wafer including at least two movable MEMS structures situated on top of one another at least in sections, a first of the MEMS structures being formed from a first substrate layer of the MEMS wafer and a second of the MEMS structures being formed from a second substrate layer of the MEMS wafer, the first substrate layer and the second substrate layer of the MEMS wafer being separated from each other by an insulating layer at least in sections and electrically conductively connected to one another at least in sections;
   an application-specific integrated circuit (ASIC) wafer, the MEMS wafer being functionally joined to the ASIC wafer; and
   a cap wafer to cap the ASIC wafer and the MEMS wafer.

13. The micromechanical component of claim 12, wherein at least one movable structure of the MEMS wafer includes a monocrystalline silicon.

14. The micromechanical component of claim 12, wherein the two MEMS structures are electrically conductively connected to one another or electrically insulated from one another.

15. The micromechanical component of claim 12, wherein a contacting element for electrically contacting the component is formed on the ASIC wafer and/or includes a through-silicon via of the ASIC wafer.

16. The micromechanical component of claim 12, wherein the micromechanical component is an inertial sensor.

17. The micromechanical component of claim 12, wherein the insulating layer includes an oxide layer.

* * * * *